United States Patent

Amundson et al.

[11] Patent Number: 4,478,352
[45] Date of Patent: Oct. 23, 1984

[54] INTEGRATED CIRCUIT COMPONENT HANDLER SINGULATION APPARATUS

[75] Inventors: Arlon J. Amundson, St. Paul; Robert J. Wurscher, Shoreview, both of Minn.

[73] Assignee: Micro Component Technology, Inc., Shoreview, Minn.

[21] Appl. No.: 379,892

[22] Filed: May 19, 1982

[51] Int. Cl.³ .................... B65H 3/24; B65H 7/14; B07C 5/02
[52] U.S. Cl. .................................. 221/13; 209/573; 221/236; 324/158 F
[58] Field of Search ........ 209/540, 542, 545, 571–575; 221/13, 192, 196, 84, 85, 236, 266; 198/358, 448, 469, 470; 324/158 F; 29/593, 705, 739–741, 759; 414/130, 131

[56] References Cited

U.S. PATENT DOCUMENTS

| | | | |
|---|---|---|---|
| 2,987,199 | 6/1961 | Zawaski | 198/358 X |
| 3,303,931 | 2/1967 | Vaughan et al. | 209/573 |
| 3,568,816 | 3/1971 | Smith et al. | 198/448 X |
| 3,761,808 | 9/1973 | Ryan | 324/158 F X |
| 4,058,219 | 11/1977 | Quinn | 209/573 X |
| 4,234,418 | 11/1980 | Boissicat | 209/542 |
| 4,351,108 | 9/1982 | Johnson | 324/158 F X |

Primary Examiner—Robert B. Reeves
Assistant Examiner—Edward M. Wacyra
Attorney, Agent, or Firm—Lawrence M. Nawrocki

[57] ABSTRACT

A handler (10) for feeding integrated circuit chip carriers (42) into a test site (14) of the handler (10) is the subject matter of this patent application. Inventive features include apparatus whereby carriers (42) are pushed laterally from a bottom end (62) of a magazine track (26) into a conveyor station (58). A pusher bar (64) can include a ramp surface (128) to raise carriers (42) above the particular carrier (42) being moved into the conveyor station (58). Further, the inventive features include structure for remotely sensing the presence of a carrier (42) at the bottom end (62) of a track (26). A rotary shuttle (148) can be incorporated for transporting carriers (42), after they have been tested, to the output section (158) of the handler (10).

11 Claims, 9 Drawing Figures

INTEGRATED CIRCUIT COMPONENT HANDLER SINGULATION APPARATUS

TECHNICAL FIELD

The present invention deals broadly with the field of electronics and semi-conductors. It deals particularly with integrated circuits. More narrowly, the invention is related to the field of handlers for maneuvering chip carriers containing such circuits into engagement with contacts at a test site so that the circuits can be evaluated for proper performance characteristics. The test site interfaces with a tester by which the circuits are analyzed. The invention specifically relates to apparatus for feeding individual chip carriers to the test site in such a manner so that contacts of the carrier are correctly engaged with contacts at the test site. Additionally, the invention includes structure whereby tested carriers are distributed into one of a number of classification bins depending upon the quality of the circuit as sensed by the tester.

BACKGROUND OF THE INVENTION

The semi-conductor industry has burgeoned in recent years. The electronics revolution occasioned by the semiconductor, and, specifically, the transistor and integrated circuit, has impacted significantly upon the consumer, industrial, governmental, and defense markets.

In many of the applications to which such electronic components are put, it is essential that they be 100% accurate in their operation and that all portions of the component function properly. In other applications, however, an IC need not meet as close tolerances as are necessary in more sophisticated applications and need not be completely functional in all circuitry paths.

For various reasons, the manufacturing process for integrated circuits, as in the case of other manufacturing processes, will produce units of different quality. For this reason, it is necessary to test the units not only to answer the relatively unsophisticated question of whether they are operable or not, but also to classify the units by degree of operability and quality. The best units can be used in applications wherein close tolerances and accuracy are essential. Those of lesser quality and integrity still might, however, be able to be used in other less demanding applications.

To this end, various high speed testing devices have been developed in order to ascertain the quality of function and integrity of various IC chips. Typically, such testers can perform testing upon in excess of three units per second. It is, therefore, necessary to provide handling equipment capable of feeding units to the test site and conveying those units away from the test site at as least as rapid a rate.

Various types of high speed handlers have been developed to solve this problem. Because of the high speed of operation, however, difficulties exist in devising structures which minimize the potential for jamming of the chip carriers as they are moved along a path through the input section of the handler, through the test site, and through the output section of the handler. The possibility of jamming is particularly likely at locations where the direction of movement of the chip carriers is changed. It is, therefore, particularly important that any handler designed to handle chip carriers at a high speed rate include structures for inhibiting canting and skewing of the carriers as they are passed therethrough.

An essential characteristic of any handler must be that it feeds chip carriers to the test site in a proper orientation. Typically, chip carriers are relatively planar in construction and have contact pads extending to only one of two oppositely facing planar surfaces. It is, therefore, essential that the proper face of the carrier be placed into engagement with the contacts at the test site in electronic communication with the tester.

In order to facilitate the proper orientation of the carriers at the test site, they must be fed into a handler with a given orientation. The handler must, thereafter, assure that, as the carriers pass through the various conveying means to the test site, they will not become inverted so that the contact pads will not engage the contacts at the test site. Additionally, because certain pins at the test site are specifically designated for engagement with certain of the contact pads, it is necessary that the handler conveying structure assure that the chip carriers are not rotated any measure about an axis extending perpendicularly to planes defined by the generally oppositely facing surfaces of the carrier. The operator of the tester can, thereby, feel relatively certain that testing of the carriers will be properly conducted and achieve a high measure of validity.

The operation of many chip carrier handlers requires that, at various stages, the machine be able to sense the presence of a carrier at a particular station. Illustrative of this requirement is the typical test site wherein, as a chip carrier is moved into position, its presence will be sensed so that a plunger will move the carrier into position wherein the contact pads engage the pins at the test site. It is understood, of course, that other stations exist with respect to which it is essential that the machine sense the presence of a carrier before some function can be initiated.

One type of device which is frequently used in order to sense the presence of a carrier at a particular station is an optical arrangement which includes a light emission device (LED) and a photosensor. The LED and sensor are positioned relative to one another on opposite sides of the station at which it is desired to sense the presence of a chip carrier. The LED and sensor are positioned so that the LED normally illuminates the sensor. When a carrier is in the station, the light beam illuminating the sensor will be broken, and electrical circuitry will actuate switches to indicate the presence of a carrier at the station. When the station is at the test site, the plunger will, thereby, be actuated to move the carrier so that the contact pads will engage the pins so that testing can be performed.

Frequently, it is desirable that, prior to testing, the chips be elevated or lowered to temperatures at least at which they will be maintained when subsequently installed in a device in which they are intended to be used. With respect to heated environmental operations, chips are frequently exposed to temperatures in excess of 100° Centigrade. In order to ensure operation under aggravated temperature conditions, test temperatures are often elevated well in excess of 100° Centigrade.

Under temperatures of this degree, however, LED sensing devices cannot operate properly and for extended periods of time. Consequently, uniquely different devices for sensing the position of a chip carrier at a particular station must be devised.

It is to these desirable characteristics and problems in the prior art that the invention of the present application is directed. The present invention is a handler which not only processes chip carriers at high speeds and limits the likelihood of misorientation, but it also processes the carriers such that jamming is minimized. Additionally, it is structured so that, if jamming does occur, jams can be cleared easily and expeditiously. Finally, it includes new means for sensing depositing of a chip carrier at a particular station. It, thereby, eliminates problems previously encountered because of inoperability of LED devices occasioned by the application of heat.

SUMMARY OF THE INVENTION

The invention of the present application is apparatus for feeding semi-conductor component carrier units such as integrated circuit chip carriers into the test site of a handler which electronically interfaces with a tester for analyzing the component for quality and integrity of circuits within the chip. The apparatus includes at least one elongated track along which the carrier units move when being fed toward the test site. The track includes a terminal, or bottom, end. The apparatus also comprises a conveyor which further transfers the units which have moved down the track to the test site for testing. The conveyor has at least one station which can be positioned laterally adjacent the bottom end of the track. The apparatus further includes a pusher which can be actuated when a carrier unit is at the bottom end of the track to urge the carrier unit laterally relative to the direction it has passed down the track and into a station of the conveyor.

The invention can incorporate means for sensing the presence of a carrier at the bottom end of the track and means, responsive to a signal from the sensing means, for actuating the pusher to urge the carrier unit into a station of the conveyor. In a preferred structure, the sensing means can utilize optics for making the determination of the presence of a carrier unit being in position for lateral transfer to the conveyor.

A number of optical systems are appropriate to effect the sensing function. In any of the systems which form embodiments of the invention, however, both a light emission device and a photosensor designed to receive emissions from the LED are disposed remotely from the location at which the presence of a carrier unit is desired to be sensed. This is so since, in the typical integrated circuit chip carrier handler, it is desireable to maintain a significantly raised temperature in order to heat the chips above a temperature at which devices in which they subsequently will operate are maintained. At such temperatures, which typically exceed 150° Centigrade, reliability and operability of LEDs and photosensors are suspect.

One embodiment of an optical system which can be used to sense the presence of a carrier unit includes a mirror array which reflects a beam of light emitted by the LED back to the photosensor. If a carrier unit is in position, the beam of light is interrupted, and the pusher will be in an enabled state wherein it can be actuated to urge the unit into the conveyor station. Conversely, if the beam is not interrupted by a carrier unit, the pusher will be in a disabled state wherein it cannot be actuated.

Although many types of mirror arrays are contemplated, one particular one comprises two mirrors wherein the LED transmits the light beam generally parallel to, and in the direction of, the direction of movement of the pusher when it urges a carrier unit into the conveyor station. A first of the mirrors is disposed below the bottom end of the track and in the beam of light. It is angled at 45° relative to the beam of light to reflect the beam 90° upwardly.

A second mirror is positioned above the bottom end of the track and in the beam of light as reflected by the first mirror. It is angled 45° relative to the reflected beam in order to further reflect the beam again 90° in a direction from which the LED transmitted the original beam. The photosensor is disposed so that it is in the path of the beam of light as reflected by the second mirror.

With this embodiment, the first and second mirrors straddle a carrier unit when one is in position at the bottom of the track. With a carrier unit so straddled by the mirrors, the unit will cause the second mirror to be eclipsed.

A second embodiment of an optic system for sensing the presence of an IC circuit utilizes a light transmitting medium such as glass. A first medium rod extends from a light source remote from the bottom end of the track to a position spaced proximate the bottom end. Similarly, a second medium rod extends from a photosensor to a position proximate the bottom end of the track so that the station at the bottom end of the track is sandwiched between the two remote ends of the rods. The ends can be beveled at 45° and silvered to form mirror surfaces so that light passing from the light source to the remote end of the first rod will be reflected and received by the remote end of the second rod for transmission therealong to the photosensor.

The pusher can comprise an elongated bar disposed for reciprocal movement along its axis of elongation. It can be actuated by a solenoid/bell crank assembly wherein the bell crank is rotatable about an axis proximate an intersection of two angularly spaced arms thereof. The bar is moved reciprocally because of its attachment, at one end thereof to one of the arms of the bell crank at a location spaced from the axis of pivoting. Pivoting of the bell crank is effected by the solenoid because of a connection of a telescoping shaft thereof to the other of the bell crank arms at a location spaced from the axis of pivoting. A preferred structure utlizes a solenoid having a shaft normally extended from a coil housing. As the solenoid is activated, the shaft will be retracted within the housing in order to effect pivoting of the bell crank.

In the preferred structure as discussed immediately above, the shaft of the solenoid can be biased to its extended position. Such biasing can be accomplished by use of a pair of springs. The springs can be attached at first ends thereof proximate a location at which the shaft is pivotally attached to the bell crank arm. Second ends of the springs can be affixed at appropriate support structure so that, as the shaft is retracted within the solenoid housing, tension upon the spring increases in order to facilitate extension of the shaft when the solenoid is deactivated. Each of the springs can form a similar acute angle with respect to an axis along which the shaft telescopes relative to the solenoid housing.

The invention, in arrower embodiments thereof, includes means for elevating up the track a carrier unit adjacent the one at the bottom of the track and any units on the track behind the adjacent carrier unit, prior to any urging of the bottommost unit into the conveyor station. Such stack-lifting structure precludes damage to adjacent carriers as a result of abrasion to edges of the units and contact pads formed peripherally therein.

A handler incorporating the invention can utilize a cylindrical sleeve roller mounted for eccentric rotation about a pin in order to inhibit rising of a chip carrier unit as it is urged into the conveyor station and rotation of the unit about an axis extending generally normally to the unit. The sleeve is adjustable in the direction in which carrier units are urged into the conveyor station so that it can be brought substantially into engagement with an adge of the unit to inpinge both downwardly and laterally thereupon regardless of the size of the carriers being tested.

Further, an apparatus in accordance with the present invention can include a rotary shuttle for receiving chip carrier units after they exit the test site in order to convey those units to a sort shuttle for distribution in response to a classification ascertained during testing. The rotary shuttle can be generally cylindrically in shape and have a plurality of longitudinally extending slits formed therein, in which slits carrier units can be received when released from the test site. The shuttle can rotate in a constant direction and in angular increments so that, after one unit is received within a slit and the rotary shuttle is rotated to deposit the unit into the sort shuttle, another slit in the rotary shuttle will be in position beneath the test site to receive the next carrier having been tested.

The invention of the present application is thus improved apparatus for providing single chip carrier units at the test site of a handler device for testing and for conveying those units, after testing, to classification bins. More specific features and advantages obtained in view of those features will become apparent with reference to the detailed description of the invention, attached claims, and accompanying drawing figures.

DETAILED DESCRIPTION OF THE INVENTION

Figure 1:
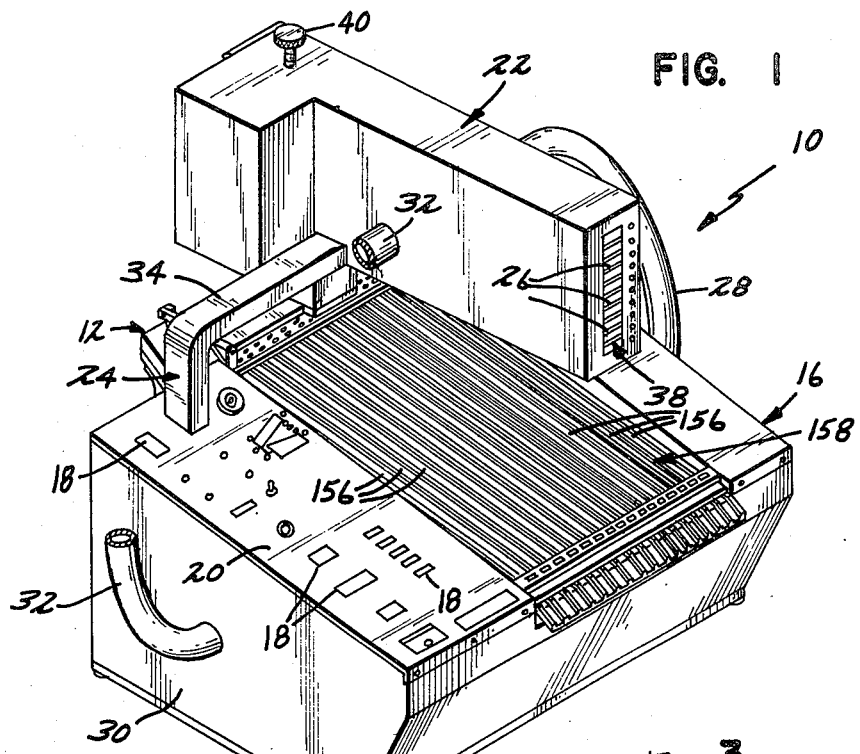
FIG. 1 is a perspective view of a handler device embodying the various inventive features of the present application.
Figure 2:
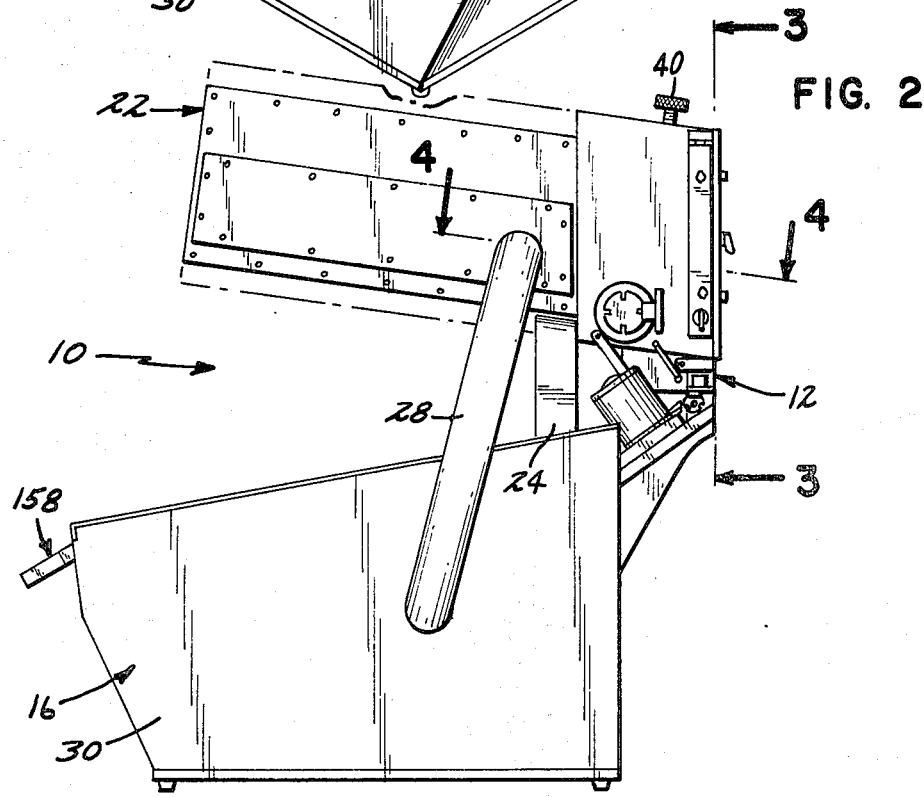
FIG. 2 is a side elevational view of the handler of FIG. 1.
Figure 3:
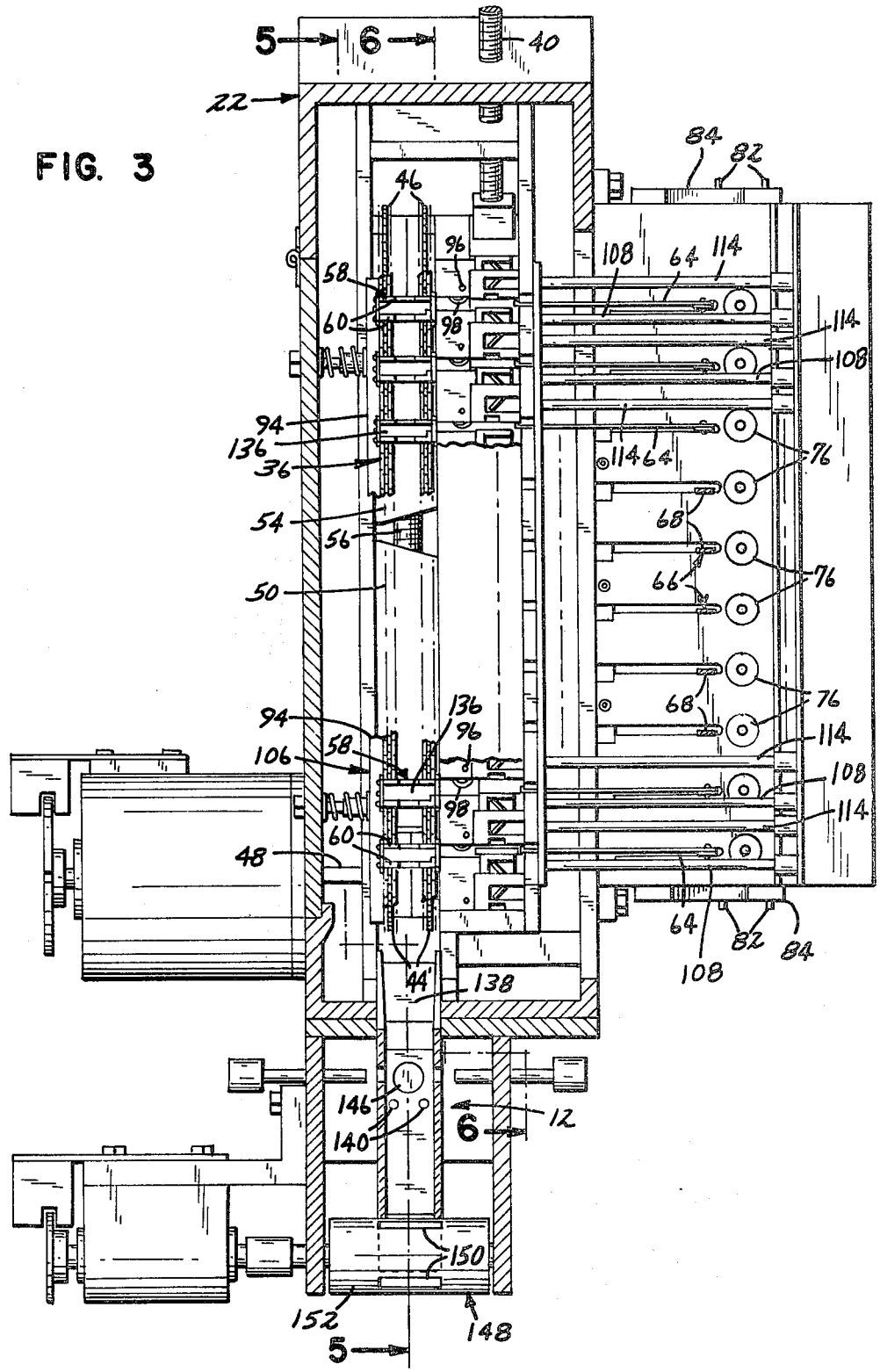
FIG. 3 is a view taken generally along the line 3—3 of FIG. 2.
Figure 5:
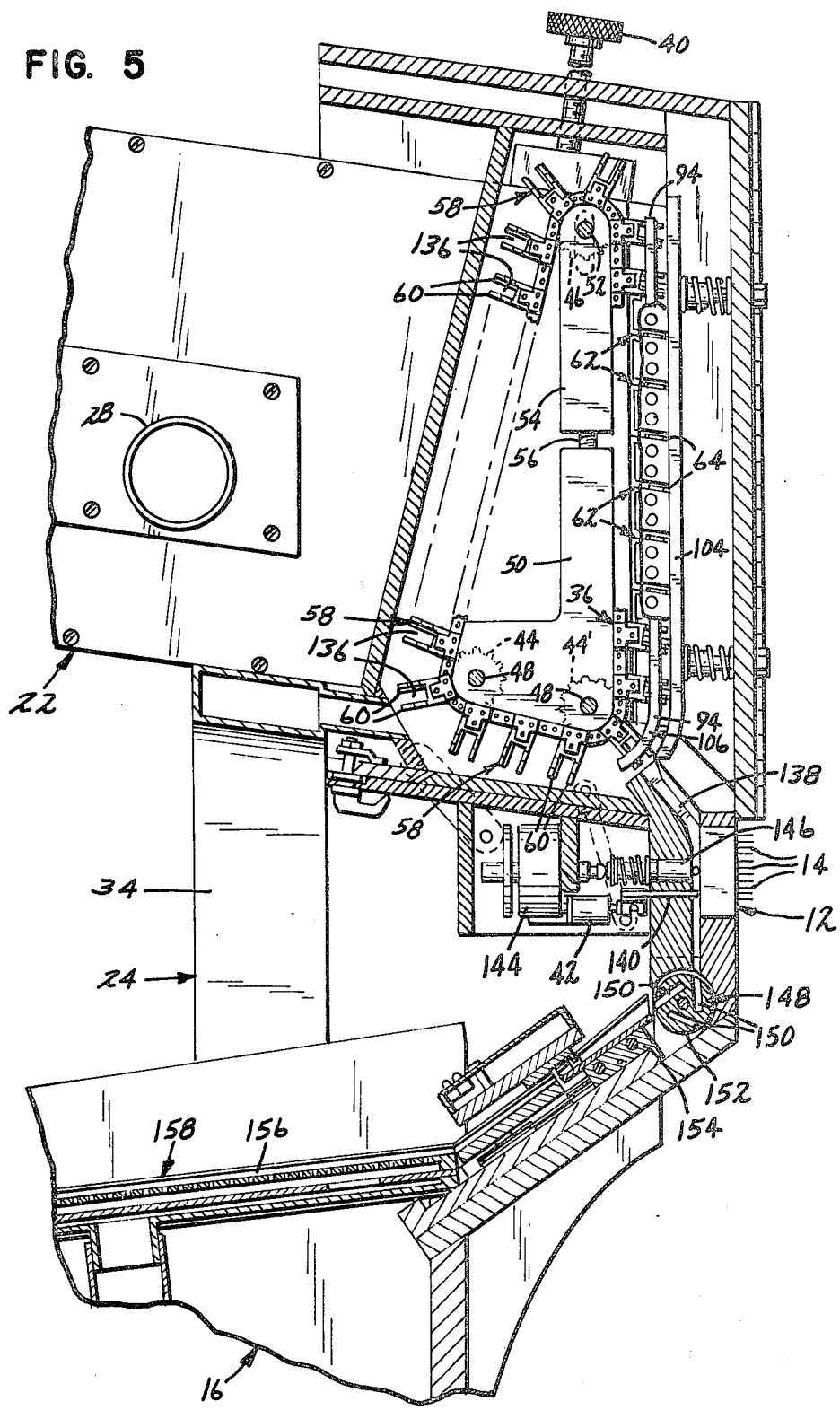
FIG. 5 is a view taken generally along the line 5—5 of FIG. 3.

Referring now to the drawings wherein like reference numerals denote like elements throughout the several views, FIG. 1 illustrates a handler device 10 used in conjunction with a semi-conductor component tester. The handler device 10 includes a test site 12 (as best seen in FIGS. 3 and 5) where each of a multiplicity of carriers mounting an IC chip are consecutively fed for testing. As seen in FIG. 5, the test site 12 has a multiplicity of leads 14, each lead extending from a pin (not shown) within the test site 12. When a chip carrier is fed to the test site 12, contact pads positioned about the periphery of the chip carrier are brought into engagement with the pins at the test site 12. For this reason, therefore, orientation of the chip carrier is particularly important. Particular leads 14 extending from the test site 12 to the tester are specifically designated to communicate electronically with a particular one of the contact pads on the carrier.

Referring then to FIG. 1, the handler 10 illustrated includes a cabinet 16 in which are housed various elecvtronic function components, a hot air blower (not shown), and other elements. Various controls and function indicia 18 are mounted on a generally upwardly facing panel 20 of the cabinet 16. A magazine 22 from which chip carriers are fed to the test site 12 is held above the cabinet 16 by appropriate support means 24.

Figure 6:
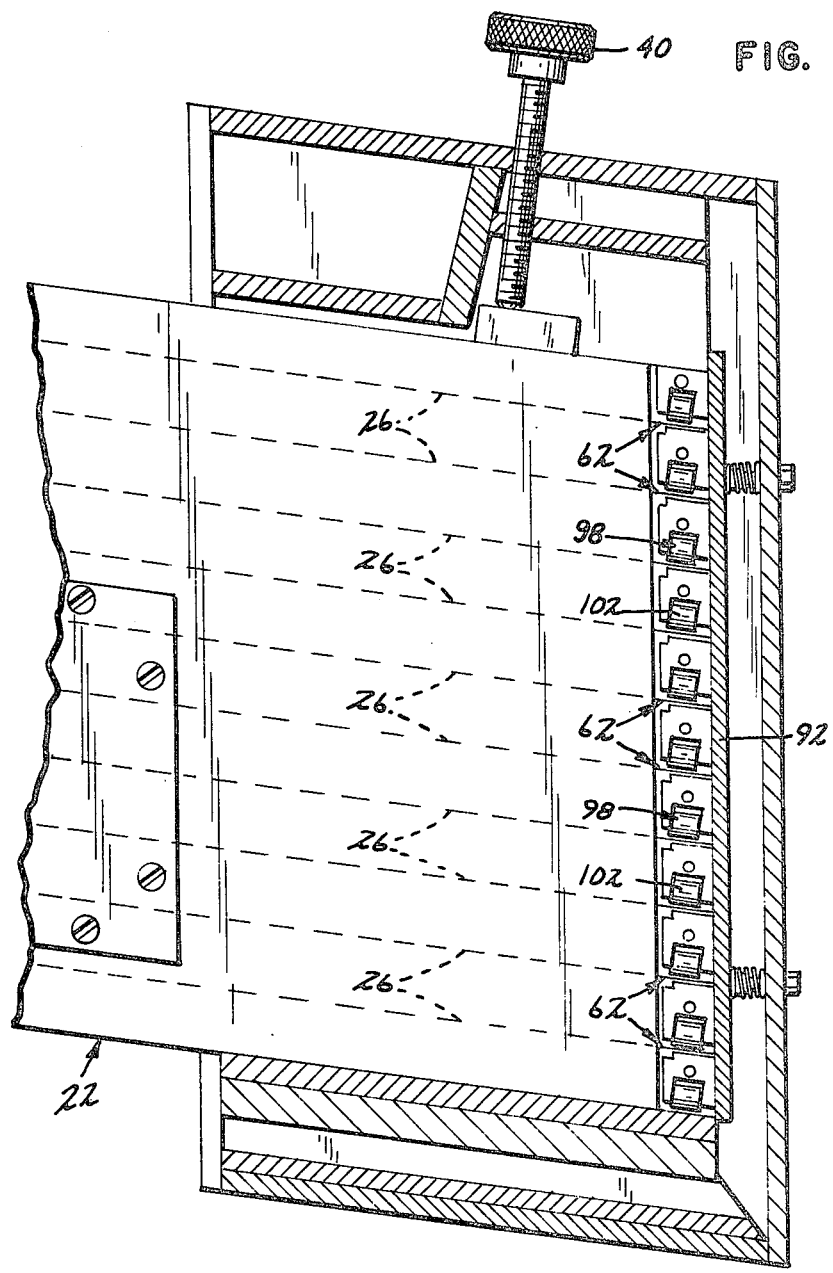
FIG. 6 is a view taken generally along the line 6—6 of FIG. 3.

As best seen in FIG. 6, the magazine 22 can include a plurality of downwardly sloped tracks 26 down which carriers move in being fed to the test site 12. Depending upon the type of movement system, the angle of inclination can vary between 1° and in excess of 35°.

Referring again then to FIG. 1, a hot air conduit 28 exits a side wall 30 of the cabinet 16 and enters the magazine 22 through a hot air fitting therein. The air can be used to both float the carriers down the magazine tracks 26 by forming an air film thereon and heat the carriers to temperatures at which the chips mounted thereon normally operate when installed in a device with which they are intended to be used. The chips can, thereby, be tested under conditions simulating normal operating conditions. A typical temperature to which the carriers in the magazine 22 are heated is in excess of 150° Centigrade.

A hot air return duct 32 can be provided to recirculate the air which had passed through the magazine 22 back to the blower and heater unit disposed within the cabinet 16. A thermally sealed heating system can, thereby, be provided in order to minimize the demands placed upon the heater unit.

Also seen in FIG. 1 is a return duct 34 for heated air which has been channeled to the test site 12 and a conveyor area to maintain the temperature of the chip carriers being tested through the time at which they have been ejected from the test site 12 after completion of testing. The air conducted to the test site 12 and conveyor area can flow through a conduit branching off a main hot air conduit. Similarly, the return duct 34 from the test site 12 and conveyor area can merge with the main return duct.

A magazine 22 having ten vertically spaced tracks 26 is illustrated. It will be understood, of course, that the particular number of tracks 26 provided can vary although spacing between tracks 26 will necessarily be the same as verticle spacing between stations on the conveyor 36 which are positionable laterally adjacent the bottoms of the tracks 26.

The particular handler 10 illustrated in the figures incorporates a modularity feature wherein chip carriers of different sizes can be accommodated. To this end, a magazine insert 38 capable of accommodating a particular size of carriers can be interchanged for another insert which accommodates carriers of a different size. Means can be provided for securing the particular magazine insert 38, when it is in position, within the magazine 22. A knob 40 which impinges upon an upper surface of the insert 38 when it is in position can be provided for this purpose. By rotatably adjusting the knob 40 so that it screws downwardly, secure retention of the insert 38 within the magazine 22 can be effected.

A conveyor 36 by which chip carriers 42 are immediately transported to the test site 12 is best illustrated in FIGS. 3 and 5. The conveyor 36 is endless in nature and is shown as being disposed for running about three sprockets 44, 44', 46 in a generally vertically extending plane. Two of the sprockets 44, 44' are fixed for rotation about axles 48, 48' mounted to a lower tensioning member 50, and the third 46 of the sprockets is disposed for rotation about an axle 52 mounted to an upper tensioning member 54. By urging the tensioning members 50, 54 away from one another along a shaft 56, the correct amount of tension can be applied to the conveyor 36.

Each of a plurality of conveyor stations 58 includes a pair of finger-like elements 60 between which one chip carrier 42 is positioned as the conveyor 36 runs downwardly along the back side of the handler 10 in feeding the carriers 42 to the test site 12. With respect to a particular station 58 passing downwardly proximate the back side of the handler 10, a lower of the finger-like projections serves as a floor on which the carrier can be seated, and the upper of the projections functions as a covering ceiling.

As best seen in FIG. 3, a vertical plane defined by the conveyor 36 is substantially parallel to a vertical plane defined by the tracks 26 within the magazine 22. The plane defined by the conveyor 36 is closely spaced laterally from the bottoms 62 of the magazine tracks 26, and the vertical distance between each of the stations 58 of the conveyor 36 is substantially the same as the distance between the bottoms 62 of the tracks 26. Each of the stations 58 can, therefore, be positioned laterally adjacent one of the bottom ends 62 of the tracks 26.

Figure 4:
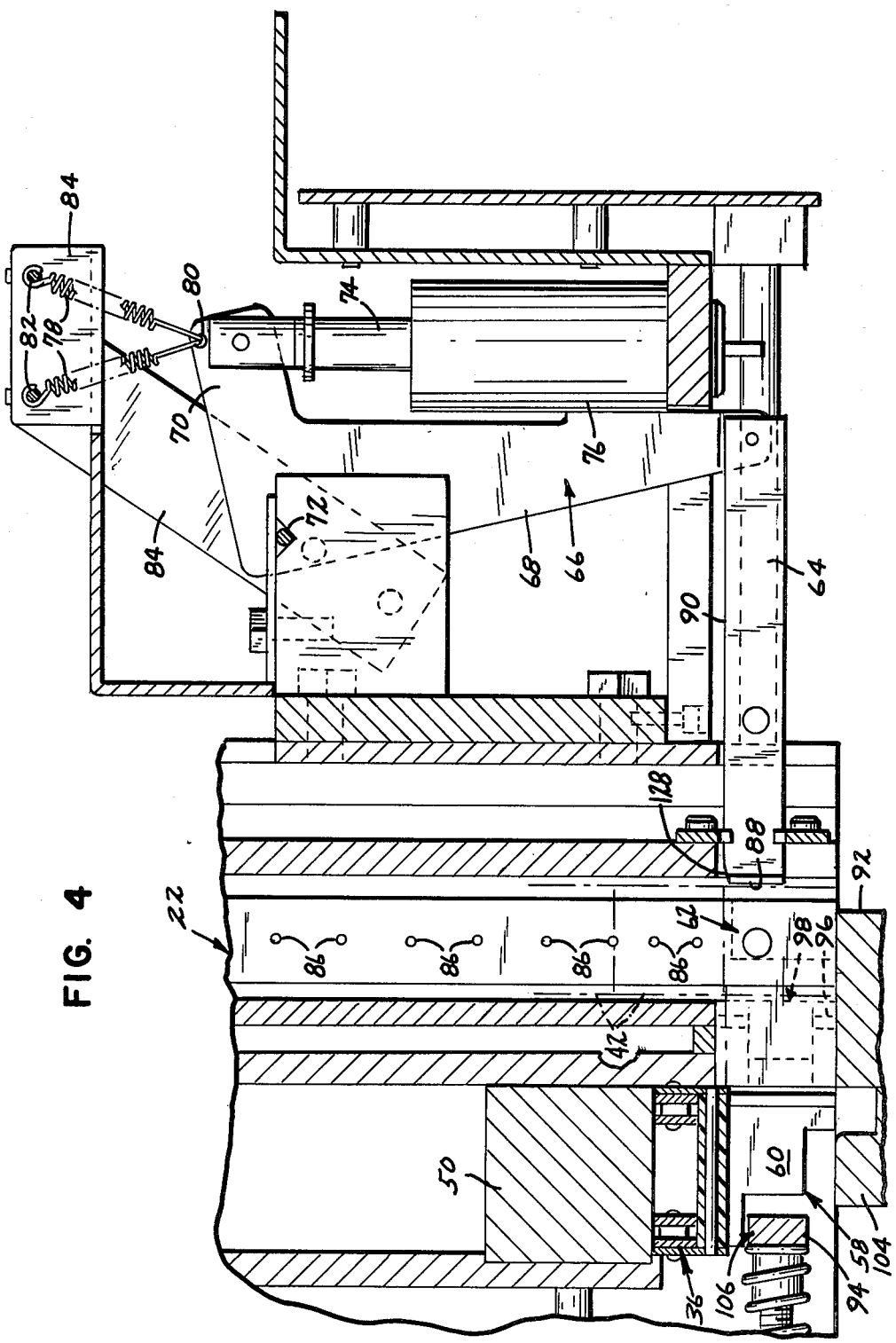
FIG. 4 is a view taken generally along the line 4—4 of FIG. 2.

Referring now to FIG. 4, the spatial relationship of a track 26, a conveyor station 58, and a pusher bar 64 actuable to urge a carrier unit 42 at the bottom of the particular track 26 into the station 58 of the conveyor 36 is illustrated. FIG. 4 further illustrates means for actuating the pusher bar 64. The actuation means includes a bell crank 66 which is formed by the rigid intersection of first and second arms 68, 70. The bell crank 66 is shown as being mounted for pivoting about an axis 72 extending generally vertically proximate the intersection of the arms 68, 70.

The pusher bar 64 is disposed for reciprocating movement (from right to left and vice versa as viewed in FIG. 4). A right end of the pusher bar 64 is shown as being pivotally attached to an end of the first arm 68 of the bell crank 66 remote from the intersection of the two arms 68, 70. As the bell crank 66 is rotated about its axis 72 of pivoting, therefore, the pusher bar 64 will be reciprocated.

An end of the second arm 70 of the bell crank 66 remote from the intersection of the arms 68, 70 is shown as having pivotally attached thereto the end of a shaft 74 remote from a solenoid housing 76 relative to which the shaft 74 telescopes. The shaft 74 is biased to a normally extended position by a pair of springs 78 hooked, at first ends thereof, into an eye 80 formed in the remote end of the second bell crank arm 70. Opposite ends of the springs 78 are hooked about generally vertically extending pins 82 mounted in elements 84 of the handler frame structure.

When the handler 10 automatically determines, by means of electronic components, that a chip carrier 42 is in position at the bottom end 62 of the particular track 26 corresponding to a particular pusher 64 and its actuation structure, that a conveyor station 58 laterally adjacent the chip carrier 42 is empty, and that it is proper to urge the carrier 42 into the station because it has attained a threshhold temperature required for testing, a current is induced in the solenoid windings. The solenoid, thereby, functions to retract the shaft 74 within the housing 76, overcoming the bias of the springs 78. The bell crank 66 is, thereby, rotated about its pivot axis 72 in a clockwise direction as viewed in FIG. 4. The pusher bar 64 is, consequently, urged leftwardly as seen in that same figure.

FIG. 4 illustrates the track 26 down which chip carriers 42 pass as being perforated, the perforations 86 being spaced and aligned along a direction in which the carriers 42 move down the track 26. The perforations 86 allow heating air to encircle the carriers 42 and heat the chips to the test temperature. Further, when the angle of inclination of the tracks 26 is relatively small, the heating air can pass upwardly through the perforations 86 to create an air cushion thereon so that the carriers 42 can be floated gently down the surface of the track 26 to the bottom end 62 thereof.

A number of chip carriers 42 are illustrated in phantom in FIG. 4. When the solenoid shaft 74 of the pusher bar 64 actuation means is in its normally extended position, a leading edge 88 of the pusher bar 64 is closely proximate one edge of the carrier 42 in the bottommost position of the track 26. The pusher bar 64 has a side 90, generally perpendicular to the leading edge 88, which is aligned substantially along the intersection of the bottommost carrier and the second carrier immediately adjacent to the bottommost carrier. Since the pusher bar 64, in the embodiment illustrated, is not adjustable along the track 26 down which the chip carriers 42 pass, the side 90 of the pusher bar 64 defines where the line of engagement between the two lowermost carriers must be. When a magazine insert 38 for accommodating smaller chip carriers 42 is used, a first stop 92 must be adjusted so that the stack of carriers 42 does not move downwardly along the track 26 to a point at which the line of engagement between the two lowermost carriers 42 bypasses the side 90 of the pusher bar 64.

Similarly, the lateral dimension of the conveyor station 58 can be adjusted by a second stop 94 movable to the right as viewed in FIG. 4.

Figure 7:
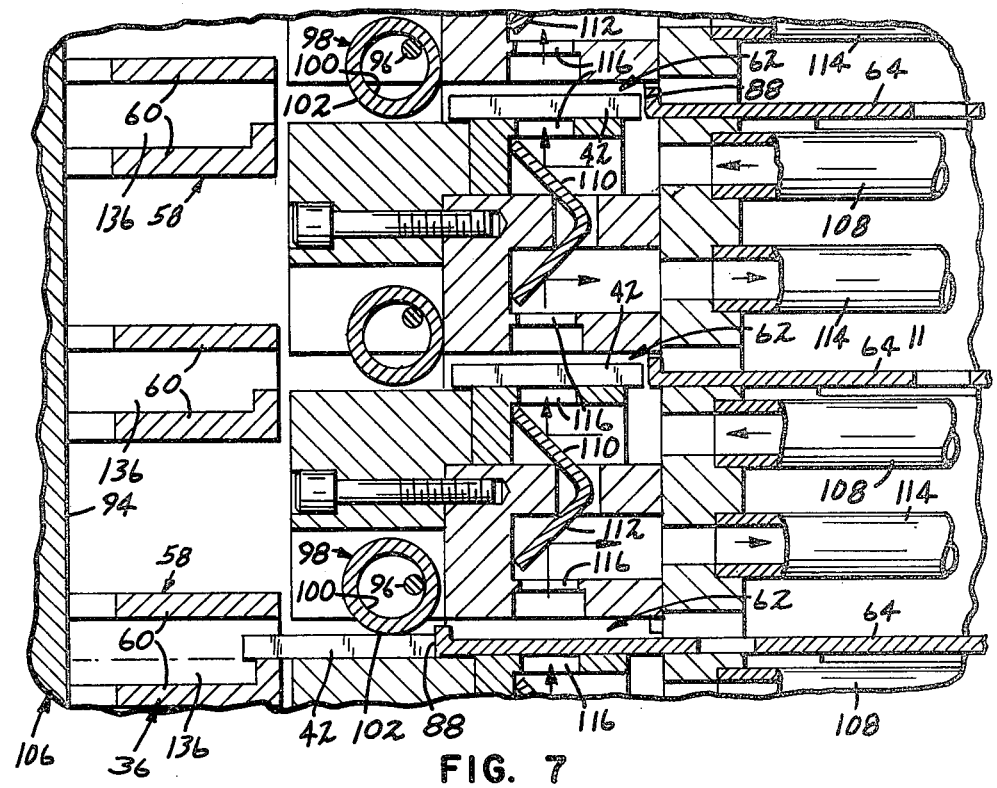
FIG. 7 is an enlarged view illustrating chip carrier unit impingement sleeves in accordance with the present invention and a first embodiment of means for sensing the presence of a carrier unit at the bottom end of a feed track.
Figure 8:
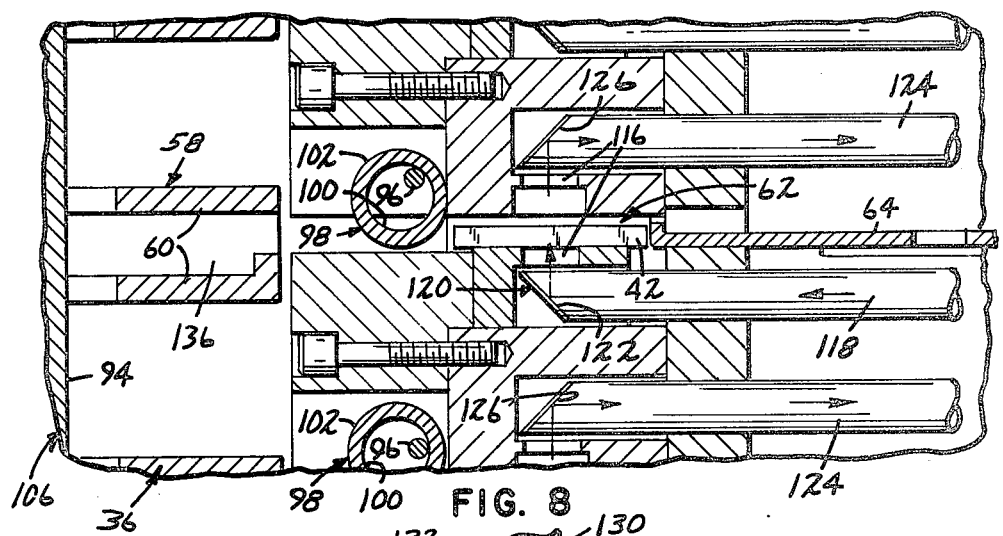
FIG. 8 is an enlarged view illustrating a second embodiment of means for sensing the presence of a carrier unit at the bottom end of a feed track.
Figure 9:
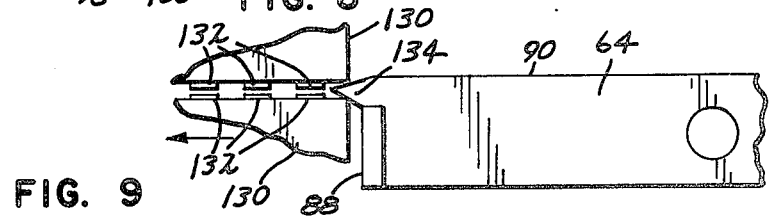
FIG. 9 is a view illustrating an alternative embodiment of a stack lifter structure.

FIG. 4 illustrates, in phantom, a shaft 96 which is maintained, as can be seen in FIGS. 7 and 8, generally horizontal. FIGS. 7 and 8 illustrate a plurality of the shafts 96, one corresponding to each of the tracks 26 proceeding downwardly within the magazine 22. A shaft is disposed relative to each track 26 above a plane along which a carrier unit 42 is urged by the pusher bar 64 and on a side of the bottom 62 of a track 26 opposite the side on which the pusher bar 64 is diposed.

A generally cylindrical sleeve 98 having an axially extending bore 100 formed therethrough is shown as being mounted on each of said shafts 96. The diameter of the bore 100 is somewhat larger than the diameter of the shaft 96 so that, when the sleeve 98 is suspended from the shaft 96, it will be free to move eccentrically thereabout. The total diameter of the sleeve 98, however, is sufficiently large so that the sleeve 98 will extend downwardly wherein an outer surface 102 thereof can engage a chip carrier 42 as it passes therebeneath.

Because of the positioning of the shaft 96, the outer surface 102 of the sleeve 98 can form a wall to engage an edge of a carrier unit 42 as it comes down to the bottom 62 of the track 26. The sleeve 98 will impinge both laterally and downwardly upon the carrier 42.

A chip carrier 42, when it is at the bottom 62 of a track 26 will, therefore, be essentially contained on all four sides by the leading edge 88 of the pusher bar 64, the first stop 92, the corresponding sleeve 98, and the upwardly adjacent chip carrier on the particular track 26. It will be understood, of course, that the position of the shaft 96 can be adjusted laterally depending upon the size of the particular chip carrier 42 being tested. When a magazine insert 38 containing smaller chip carriers 42 is inserted into the magazine 22, the shafts 96 suspending the sleeves 98 would be moved to the right as viewed in FIGS. 7 and 8. When a magazine insert 38 accommodating larger chip carriers 42 is in the magazine 22, the shafts 96 would be moved to the left as viewed in those figures.

The size of the conveyor stations 58 can be adjusted in a similar manner. The first stop 92 can further include a portion 104 movable toward the back of the conveyor station 58 to restrict the distance that smaller chip carriers 42 can move toward the back of the handler 10. Further, a J-bar 106 can be provided to adjustably limit the lateral movement of smaller carriers within the conveyor stations 58.

As previously discussed, the handler 10 can include means for sensing whether a chip carrier 42 is in position at a bottom end 62 of a particular track 26. Typically, an optical array is used for sensing whether a particular object is in a particular location. Such an array might include a light emission device and a photosensor normally illuminated by the device. When an object is in the particular location with respect to which information is sought, the photosensor will be eclipsed by the device and the absence of illumination of the photosensor will initiate an electrical signal indicating the presence of the object.

With structures as those discussed in this application, however, existing temperatures cause damage to LEDs and photosensors such that information provided by such arrays is, at best, unreliable.

The present invention, therefore, provides means by which the presence of a chip carrier 42 at the bottom end 62 of a track 26 can be sensed by use of an LED and photosensor array (not shown) remote from the bottom 62 of the track 26. FIG. 7 illustrates a first embodiment for accomplishing this sensing. An LED emits a beam of light through a first tubular structure 108 in a direction of, and aligned with, the direction of movement of the pusher bar 64 in urging the carrier 42 into a conveyor station 58. A first mirror 110 is positioned proximate an end of the tubular structure 108 remote from the LED and in the beam of light emitted thereby. The mirror 110 is angled at 45° relative to the direction of the beam of light and reflects the beam upwardly 90° from the direction along which it passed through the first tubular structure 108.

A second mirror 112 is disposed above the first mirror 110 and in the beam of light as reflected by the first mirror 110. It is also angled 45° relative to the beam as reflected by the first mirror 110 in order to divert the light beam 90° to the right and in a direction opposite that along which it is emitted by the LED. The beam, thereafter, enters a second tubular structure 114 and illuminates the photosensor at a right end thereof.

As can be seen, the mirrors 110, 112 can be positioned laterally so that they sandwich a station at the bottom end 62 of a track 26 therebetween. Since apertures 116 are formed in both upper and lower walls of the station at the bottom end 62 of the track 26 in order to normally afford illumination of the photosensor, a chip carrier unit 42 in the station will cause eclipsing of the second mirror 112 and, consequently, of the photosensor.

It will be understood that the particular mirror arrangement illustrated is not exclusive, and other mirror arrangements can function equally as well. In view of the disclosure of this specifically claimed mirror array, other mirror arrangements can be envisioned. One might include a single mirror reflecting a beam of light from an LED to a photosensor wherein presence of a chip carrier at the bottom end of a track would break the beam to cause the photosensor to not be illuminated. Other multiple mirror arrangements can also be envisioned.

A second sensing arrangement in which the LED and photosensor can be maintained remote from a high temperature location is illustrated in FIG. 8. A first light transmitting medium rod 118 having one end at a light source such as an LED transmits light to an end 120 of the rod 118 remote from the LED. That end can include a beveled, silvered surface 122 to act as a reflecting mirror. A second rod 124 having a beveled, silvered surface 126 opposite that of the first rod 118 can be provided to transmit light therealong to a photosensor. The beveled, silvered surfaces 122, 126 of the rods 118, 124 can be positioned relative to one another so that they sandwich the station at which the presence of a chip carrier 42 is desired to be known therebetween, the surfaces 122, 126, as in the case of the angled mirrors 110, 112 of the first embodiment, can be beveled at angles so that light will be angled from the surface of the first rod to that of the second rod. If a chip carrier 42 is present between the remote ends of the rods 118, 124, an electrical signal indicating the presence of a carrier will be generated in response to the eclipsing of the beveled surface of the second rod 124.

The handler 10 can include means (not shown) for determining whether a particular conveyor station 58 adjacent the bottom end 62 of a track 26 is empty. In operation, when a chip carrier is in position at the bottom end of a track 26 and the conveyor station 58 laterally adjacent is empty, the pusher bar 64 can be actuated to urge the chip carrier 42 into the conveyor station 58. An electrical signal to the solenoid will be initiated, and the solenoid will be actuated to cause current to flow through the windings thereof. In response, the solenoid shaft 74 will be retracted into the solenoid housing 76, and the bell crank 66 will be caused to be pivoted about its axis 72. The pusher bar 64 will, consequently, be urged leftwardly as viewed in FIG. 4 and into engagement with the carrier at the bottom end of the track 26.

In order to minimize abrasion between the abutted edges of the carriers 42, a corner of the bar at an intersection of the edge and the side thereof can be beveled to form a ramp 128 up which the carrier adjacent the bottommost one and any carriers above the adjacent one will ride as the bar 64 continues to move leftwardly. The abutting surfaces will, thereby, be moved out of engagement to preclude abrasion damage.

Another type of chip carrier which can be processed by the handler has a main body portion 130 and a multiplicity of electrical contact pads 132 extending peripherally outwardly from the main body portion 130. The edges of such carriers have a castled configuration. Such a carrier can be seen in FIG. 8. When such chip carriers move down a magazine track 26, only the electrical contacts 132 of adjacent carriers 42 will be in engagement. The main body portions 130 of adjacent carriers will be slightly spaced.

When these carriers are being tested, the operation of the pusher bar 64 can, in the worst case, cause damage to a number of the chip carriers 42. Even if the carriers are not damaged, they can become jammed if contacts of adjacent carriers engage alternately such as gear teeth do.

An alternative embodiment of a "stack lifter" can be provided and used with such carrier units. A ramp member 134 extending forwardly from the engagement edge 88 of the pusher bar 64 at the intersection of the edge 88 with the side 90 can be provided. As the pusher bar 64 moves toward enagement with the bottommost carrier, the ramp member 134 will engage the main body portions 130 of the bottommost unit and the unit adjacent thereto. The second lowermost chip carrier will, thereby, be urged away from the bottommost unit. The contacts 134 of the second lowermost unit will, consequently, be urged out of engagement with those of the bottommost unit prior to the point at which the bottommost unit is engaged by the leading edge 88 of the pusher bar 64.

The portion 104 of the first stop 92 which precludes movement of carriers 42 centrifugally outwardly from their positions in the stations 48 of the conveyor 36 follows the conveyor 36 as it passes around one of the lower sprockets 44' by which it is tensioned. Chip carriers are, thereby, held within their stations 58 within the conveyor 36 until the pocket 136 between the finger-like projections 60 of a station 58 is in registration with a chute 138 extending downwardly through the test site 12. When the pocket 136 becomes in registration with the chute 138, the carrier 42 will fall downwardly into the chute 138 at an acute angle with respect to the horizontal. The chute 138, thereafter, changes directions to a generally vertical orientation. The platen-like carriers, thereby, become oriented generally vertically.

The test site 12 includes a pair of pins 140, actuated by a solenoid 142, which are normally in an extended position to obstruct passage of carriers downwardly through the chute passage 138. A carrier as it drops downwardly through the passage 138, will be stopped by these pins 140. With the carrier in such a position, its contact pads are positioned opposite electrical connecter pins conversing with contacts leading to the tester.

Means (not shown) such as an optic system previously described herein can be used to ascertain when a carrier is in position with its contact pads opposite the pins of the test site. When the presence of a carrier is sensed, an electronic signal can be sent to a solenoid 144 to actuate a plunger 146 which moves generally transversely to the direction in which the carriers pass down through the chute 138. The plunger 146 moves the chip carrier into engagement with the pins of the test site 12 so that testing can be conducted.

After completion of testing, a signal will be sent to the solenoid 142 operating the obstruction pins 140 directing those pins to retract to allow the carrier to continue its downward movement through the chute 138.

It will be understood that the running of the conveyor 36 is synchronized with testing time so that the pocket 136 of the next subsequent station of the conveyor 36 will become in registration with the chute 138 at substantially the same time as the previous carrier being tested is being released to pass away from the test site 12. Rapid and continuous operation of the handler 10 is, thereby, not impeded.

As best seen in FIG. 5, a cylindrical shuttle member 148 is disposed beneath the chute 138. It is structured for uni-directional rotation about a generally horizontal axis which lies in a plane substantially parallel to a plane defined by a chip carrier as it drops down the chute 138. The cylindrical shuttle member 148 has a plurality of angularly spaced, longitudinally extending slots 150 formed in its outer surface 152. They extend sufficiently deeply into the cylindrical member 148 so that, when one of the slots 150 is in registration with the bottom of the chute 138 and a chip carrier 42 is deposited therein, the carrier will completely enter the slot 150 so that rotation of the shuttle 148 will not be precluded.

The cylindrical shuttle 148 illustrated in the figures has three slots 150 formed therein, and the slots 150 are formed at locations about the periphery of the shuttle 148 spaced at equal angles. The entrances to the slots 150 are, therefore, spaced at 120° from adjacent slots 150.

The shuttle 148 illustrated has slots 150 formed therein which do not extend directly radially outwardly from the center thereof. Rather, they extend at acute angles with respect to tangents to the surface 152 of the shuttle 148 at the points at which the slots 150 exit. It will be understood, however, that this configuration is not exclusive.

The shuttle 148 illustrated in FIG. 5 rotates in a counter-clockwise direction as viewed in that figure. As it rotates, a chip carrier 42 deposited in one of its slots 150 will, by gravity and centrifugal force created by rotation of the shuttle exit into a sort shuttle 154 which moves rapidly across a plurality of classification bins 156 in the output section 158 of the handler 10. As seen in FIG. 1, a preferred embodiment of the handler includes sixteen classification bins 156. In operation, however, all of the bins 156 need not be used. Functional controls 18 on the panel of the cabinet 16 can select the number of bins 156 and the testing results which justify a particular chip carrier being placed into a particular bin 156.

In order to insure validity of testing, it is necessary that the orientation of a carrier 42 be establishable from the time that it is inserted into the magazine 22 along a track 26 thereof, through the test site 12, and into the output section 158 of the handler 10. Normally, chip carriers 42 are maintained in a stick in which the orientation is known. The stick can be abutted to a track 26 within the magazine 22, and the carriers can be allowed to slide downwardly onto the track 26. The assumption is, of course, that the orientation with the stick is such that, as the various chip carriers pass down the track 26, onto the conveyor 36, and down the conveyor 36, to the test site 12, they will be brought into engagement with the pins at the test site in a proper orientation.

The operation of the cylindrical shuttle member 148 and its spatial relationship to the test site chute 138 and the sort shuttle 154 are such that chip carriers will be conveyed to the various classification bins 156 of the output section 158 of the handler 10 in the same orientation in which they were fed into the magazine track 26. Consequently, if retesting of carriers distributed into a particular bin 156 is necessary, the carriers in the bin 156 can be drawn into a storage stick which can, thereafter, be engaged with one of the magazine tracks 26 in order to feed the carriers onto that track 26.

Numerous characteristics and advantages of the invention have been set forth in the foregoing description. It will be understood, of course, that this disclosure is, in many respects, only illustrative. Changes can be made in details, particularly in matters of shape, size, and arrangement of parts without exceeding the scope of the invention. The invention's scope is defined by the language in which the appended claims are expressed.

What is claimed is:

1. Apparatus for consecutively feeding semi-conductor component carrier units to the test site of a handler, which site electronically interfaces with a tester, said apparatus comprising:
    (a) a track having a surface along which carrier units move to a bottom end thereof;
    (b) a conveyor for transferring carrier units from said bottom end of said track to the test site, said conveyor having a station positionable laterally adjacent said bottom end;
    (c) an elongated, reciprocally movable pusher bar for urging a carrier unit at said bottom end of said track into said station;
    (d) a bell crank having first and second intersecting arms and being disposed for pivoting generally about an intersection of said arms, one end of said pusher bar being pivotally attached to a first of said arms at a location spaced from a point about which said bell crank pivots; and
    (e) a solenoid having a telescoping shaft and being operatively initiatable by an electronic signal to retract said shaft, said shaft having a remote end pivotally attached to a second of said arms at a location spaced from said point about which said bell crank pivots;
    (f) wherein, as said shaft telescopes, said bell crank pivots to actuate said pusher bar to urge a carrier at said bottom end of said track into said station.

2. Apparatus in accordance with claim 1 wherein said bell crank pivots to actuate said pusher bar to urge a carrier into said station when said shaft telescopes inwardly.

3. Apparatus in accordance with claim 2 further comprising means for returning said shaft to a telescopically extended position.

4. Apparatus in accordance with claim 3 wherein said return means comprises spring means to which tension is applied as said shaft telescopes inwardly.

5. Apparatus in accordance with claim 4 wherein said spring means comprises a pair of springs, each secured at one end proximate said location at which said remote end of said shaft is pivotally attached to a second of said arms, said springs being equi-angularly spaced from an axis along which said shaft telescopes.

6. Apparatus in accordance with claim 1 wherein said pusher bar has an edge engagable with a chip carrier unit at said bottom end of said track and a side extending generally perpendicular to said edge proximate a line of engagement between said chip carrier unit and a unit adjacent thereto, and wherein a corner of said bar at an intersection of said edge and said side is beveled so that said beveled surface forms a ramp up which said adjacent carrier unit and any units thereabove can ride as said bar is actuated to urge said bottom carrier into said conveyor station.

7. Apparatus in accordance with claim 1 in combination with a plurality of carrier units, each having a main body portion and a multiplicity of electrical contacts extending outwardly from said main body portion, wherein main body portions of adjacent carrier units on said downwardly sloped surface are spaced from one another when their contacts are in engagement; said pusher bar having an edge engagable with a chip carrier unit at said bottom end of said track and a side extending generally perpendicular to said edge proximate a line of engagement between contacts of said chip carrier unit at said bottom end of said track and contacts of a unit adjacent thereto, said bar further comprising a ramp member extending from an intersection of said edge and said side in a direction in which said bar moves to urge said bottommost carrier unit into said station, wherein, as said bar moves toward engagement with said bottommost carrier unit, said ramp member engages the main body portions of said bottommost unit and said unit adjacent thereto to urge said adjacent unit away from said bottommost unit and its contacts out of engagement with those of said bottommost unit prior to when said bottommost unit is engaged by said edge of said bar.

8. Apparatus for consecutively feeding semi-conductor component carrier units into a test site of a handler, which site electronically interfaces with a tester, said apparatus comprising:
    (a) a track having a surface along which carrier units move to a bottom end thereof;
    (b) a conveyor for transferring carrier units from said bottom end of said track to the test site, said conveyor having a station positionable laterally adjacent said bottom end;
    (c) pusher means actuable to urge a carrier unit at said bottom end of said track into said station; and
    (d) means for sensing the presence of a carrier at said bottom end of said track, wherein said sensing means comprises:
        (i) a light emission device remote from said bottom end of said track, said device for transmitting a beam of light;
        (ii) a photosensor remote from said bottom end of said track; and
        (iii) a mirror array comprising at least one mirror, wherein said at least one mirror reflects said beam of light to illuminate said photosensor when a carrier unit is not present at said bottom of said track, and wherein, when a carrier unit is present at said bottom end of said track, said photosensor will not be illuminated.

9. Apparatus in accordance with claim 8 wherein said light emission device transmits said light beam generally parallel to, and in the direction of, a direction of movement of said pusher means when urging a carrier unit at said bottom of said track into said station, wherein said photosensor receives light signals from a reciprocal direction, and wherein said mirror array comprises:
    (a) a first mirror in said light beam and angled 45 degrees relative thereto to reflect said beam 90 degrees; and
    (b) a second mirror in said beam as reflected by said first mirror and angled 45 degrees relative to said reflected beam;
    (c) wherein said first and second mirrors straddle said bottom end of said track and a carrier unit at said bottom of said track, when present, eclipses said second mirror.

10. Apparatus for consecutively feeding semi-conductor component carrier units into the test site of a handler, which site electronically interfaces with a tester, said apparatus comprising:
   (a) a track having a surface along which carrier units move to a bottom end thereof;
   (b) a conveyor for transferring carrier units from said bottom end of said track to the test site, said conveyor having a station positionable laterally adjacent said bottom end;
   (c) pusher means actuable to urge a carrier unit at said bottom end of said track into said station; and
   (d) means for sensing the presence of a carrier at said bottom end of said track, said sensing means comprising:
      (i) a light source remote from said bottom end of said track;
      (ii) a first light transmitting medium having an end at said light source and a remote end;
      (iii) a photosensor remote from said bottom end of said track; and
      (iv) a second light transmitting medium having an end at said photosensor and a remote end;
      (v) wherein said remote ends of said first and second media straddle said bottom end of said track and have beveled, silvered surfaces to redirect light from said source transmitted along said first medium, to said second medium, and therealong to said photosensor.

11. Apparatus for consecutively feeding semi-conductor component carrier units into the test site of a handler, which site electronically interfaces with a tester, said apparatus comprising:
   (a) a track having a surface along which carrier units move to a bottom end thereof;
   (b) a conveyor for transferring carrier units from said bottom end of said track to the test site, said conveyor having a station positionable laterally adjacent said bottom end;
   (c) pusher means actuable to urge a carrier unit at said bottom end of said track into said station;
   (d) a shaft disposed on a side of said bottom of said track opposite that on which said pusher means is disposed and above a plane along which a carrier unit is urged by said pusher means into said station, said shaft being oriented generally perpendicular to a direction in which a carrier unit is urged by said pusher means; and
   (e) a sleeve having an internal bore with an inner diameter larger than said shaft and being seated on said shaft with said sleeve being able to rotate eccentrically relative to said shaft, said sleeve further having an outer diameter such that, when suspended from said shaft, said sleeve will extend downwardly at least to said plane along which a carrier unit is urged;
   (f) wherein, when a carrier unit is at said bottom of said track said sleeve engages the unit along an edge thereof, forwardly with respect to the direction of movement to said station, and impinges both downwardly and laterally upon the carrier unit to prevent the carrier unit from rotating and rising upwardly.

* * * * *